US006814809B2

United States Patent
Matsushita et al.

(12) United States Patent
(10) Patent No.: US 6,814,809 B2
(45) Date of Patent: Nov. 9, 2004

(54) COATING AND DEVELOPING APPARATUS AND PATTERN FORMING METHOD

(75) Inventors: Michiaki Matsushita, Koshi-Machi (JP); Masataka Matsunaga, Koshi-Machi (JP); Seiji Kozawa, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 230 days.

(21) Appl. No.: 10/004,892

(22) Filed: Dec. 7, 2001

(65) Prior Publication Data

US 2002/0076658 A1 Jun. 20, 2002

(30) Foreign Application Priority Data

Dec. 8, 2000 (JP) ........................................ 2000-374836

(51) Int. Cl.[7] .............................................. B05C 11/02
(52) U.S. Cl. ..................... 118/666; 118/665; 118/52; 335/68; 427/9; 427/8
(58) Field of Search ................ 118/666, 665, 118/52; 35/68; 427/9, 8

(56) References Cited

U.S. PATENT DOCUMENTS

| | | | |
|---|---|---|---|
| 5,939,130 A | * | 8/1999 | Shiraishi et al. ............. 427/9 |
| 6,126,703 A | | 10/2000 | Akimoto et al. |
| 6,147,329 A | | 11/2000 | Okamura et al. |
| 2002/0025375 A1 | * | 2/2002 | Takamori et al. ........... 427/240 |

\* cited by examiner

Primary Examiner—John A. McPherson
Assistant Examiner—Daborah Chacko-Davis
(74) Attorney, Agent, or Firm—Oblon, Spivak, McClelland, Maier & Neustadt, P.C.

(57) ABSTRACT

A coating and developing apparatus has an interface section equipped with a temperature adjuster (a cooling unit). A temperature-raised substrate due to exposure on periphery of the substrate outside a circuit-forming area thereon is adjusted to a predetermined temperature by the temperature adjuster and then transferred to an exposing apparatus. The temperature adjustments before exposure provide almost the same temperature over many substrates to be transferred to the exposing apparatus for less thermal effects to exposing processing, thus achieving high yields. The interface section is further provided with first and second transfer mechanisms, the first serving to transfer substrates between the processor and the exposing apparatus and the second serving to transfer substrates to each unit of a shelf section, for high transfer performance, thus achieving high throughput.

18 Claims, 10 Drawing Sheets

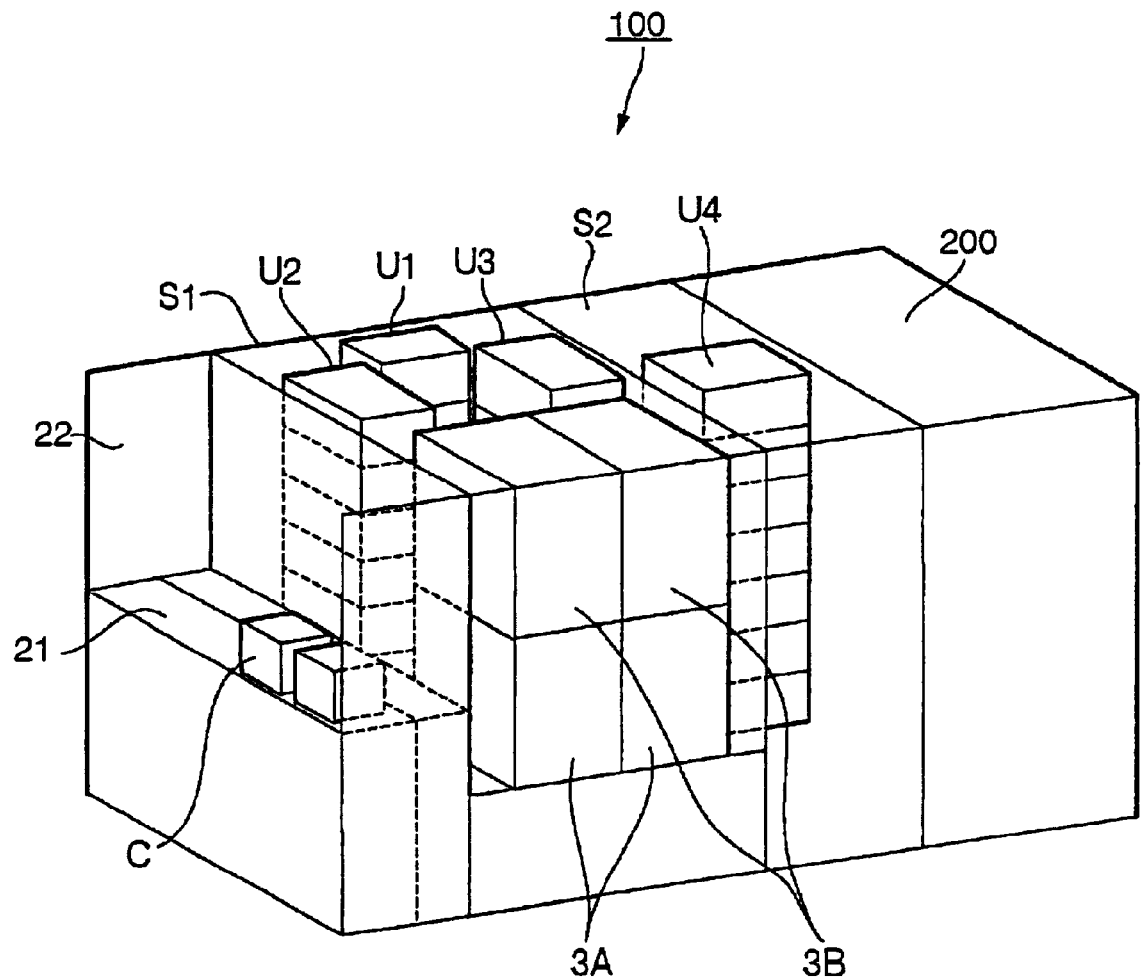
F I G. 4

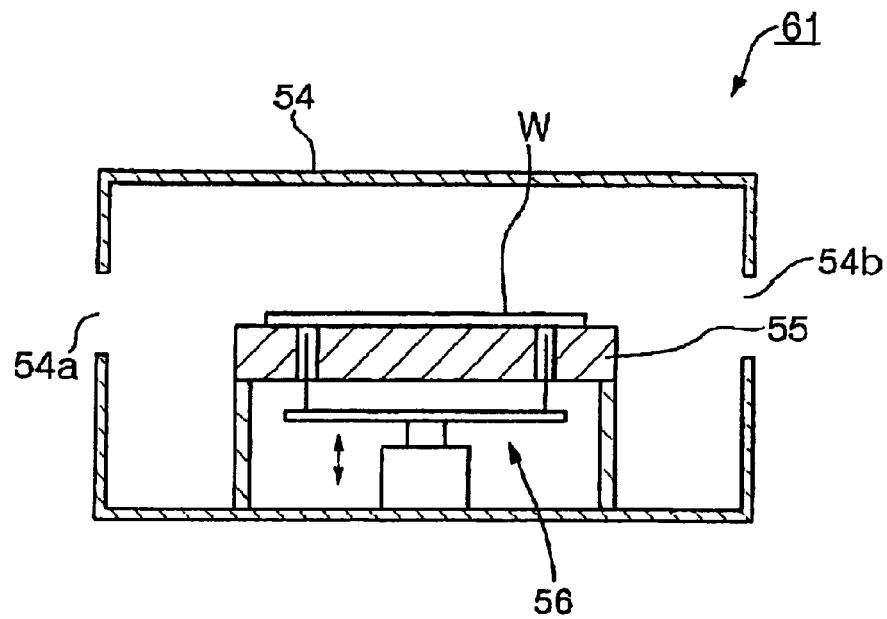
F I G. 10
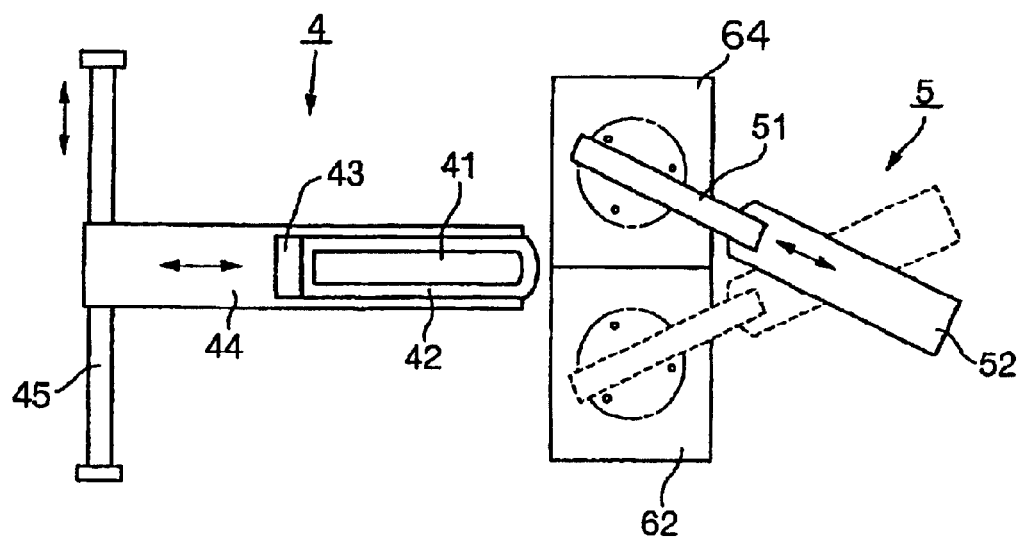
F I G. 11

COATING AND DEVELOPING APPARATUS AND PATTERN FORMING METHOD

FIELD OF THE INVENTION

The present invention relates to a coating and developing apparatus for forming resist films on substrates such as semiconductor wafers, LCD substrates (glass substrates used for liquid crystal displays) and developing the substrates after exposure to form a desired pattern thereon and also a pattern forming method for forming a desired pattern with this apparatus.

BACKGROUND OF THE INVENTION

Photolithographic techniques in process for manufacturing semiconductor devices and LCDs, etc., include the following steps.

Firstly, a substrate such as a semiconductor wafer (called wafer hereinafter) is applied a resist solution thereon to be coated with a resist film. The resist film is exposed to a desired pattern through a photomask. A resist film with the desired pattern is then formed through developing processing. A series of these processing are carried out in a system equipped with a coating and developing apparatus and an exposing apparatus connected to each other.

FIG. 1 is a plan view showing such a known system. A cassette C containing substrates, for example 25 semiconductor wafers W, is transferred into a carrier stage 1 on a carrier station A1. Connected to the carrier station A1 is a processing block A2. Connected further to the processing block A2 is an exposing apparatus A4 via an interface block A3.

Each wafer W contained in the carrier C on the carrier stage 1 is picked up by a loading arm 11 and transferred to a coating unit 13 via a transfer mechanism of a shelf unit 12A, for resist coating. The wafer W is then transferred to a cooling section 15 of a shelf unit 12B by a wafer transfer mechanism 14, as shown in FIG. 2. The wafer W is received by a transfer arm 16 of the interface block A3 and transferred to peripheral exposing apparatus 17 of the interface block A3.

The peripheral exposing apparatus 17 exposes the periphery of the wafer W to remove a resist on the periphery, which may otherwise cause generation of particles in the later processing. The wafer W that has been subjected to peripheral exposure is, for example, once transferred to a buffer cassette 18 of the block A3. The wafer W is then transferred, via the transfer arm 16, onto a loading stage (not shown) on the exposing apparatus A4 for exposure.

The exposed wafer W is transferred by the transfer arm 16 of the interface block A3 to the processing block A2 via a loading section 19 of the shelf unit 12B of the processing block A2. After developed by a developing unit (not shown) provided under coating unit 13, the wafer W is returned to the cassette C by the wafer transfer mechanism 14 and the loading arm 11.

The transfer arm 16 provided on the interface block A3 can move forward/backward and upward/downward, and rotate about a vertical axis, and further move in one horizontal-axis direction along a horizontal rail.

Peripheral exposure for the wafers W formed on which is a very narrow resist pattern in accordance with miniaturized semiconductors will cause temperature increase of, for example, 1° C. for the wafers W due to ultraviolet radiation. Moreover, loading the wafers W into the buffer cassette 18 before transfer to the exposing apparatus A4 will cause generation of heat in the tight cassette 18, the wafer temperature being thus hardly decreased because heat is hardly released.

It is a requirement for exposing processing that the wafers W are at a certain temperature set at the exposing apparatus A4. Temperature change outside the set temperature could cause wafer expansion or contraction with low accuracy of alignment in exposure, thus resulting in low pattern-size fidelity.

Recent trends in semiconductor fabrication are higher processing speed for the exposing apparatus A4 and shorter waiting time for the wafers W in the buffer cassette 18. These requirements do not allow sufficient decrease in wafer temperature raised due to peripheral exposure while the wafers W are waiting for exposing processing. This often causes temperature increase for the wafers W while being transferred to the exposing apparatus A4, which results in low yields due to effects of heat generated during exposure and thus causing low productivity.

SUMMARY OF THE INVENTION

A purpose of the present invention is to provide a coating and developing apparatus and a pattern forming method for providing stable substrate temperature in exposure processing, thus achieving high yields, high transfer performance and high throughput.

The present invention provides a coating and developing apparatus comprising: a carrier table on which at least one carrier containing a plurality of substrates is set; a processor for applying a resist on each substrate taken out from the carrier set on the carrier table and developing the substrate after being subjected to exposing processing; and an interface section for transferring the resist-coated substrate between the processor and an exposing apparatus for applying the exposing processing to the resist-coated substrate, the interface section including; at least one temperature adjuster for adjusting a temperature of the substrate to an appropriate temperature for the exposing processing before the substrate is transferred to the exposing apparatus; and a transfer mechanism for transferring the substrate among the processor, the temperature adjuster and the exposing apparatus.

Moreover, the present invention provides a coating and developing apparatus comprising: a carrier table on which at least one carrier containing a plurality of substrates is set; a processor for applying a resist on each substrate taken out from the carrier set on the carrier table and developing the substrate after being subjected to exposing processing; and an interface section for transferring the resist-coated substrate between the processor and an exposing apparatus for applying the exposing processing to the resist-coated substrate, the interface section including; a shelf section having a plurality of processing units for containing or processing the substrate; a first transfer mechanism for transferring the substrate between the processor and the exposing apparatus; and a second transfer mechanism for receiving the substrate transferred from the processor by the first transfer mechanism and transferring the received substrate to any of the units of the shelf section.

Moreover, the present invention provides a method of forming a pattern comprising the steps of: applying a resist on a surface of a substrate; adjusting a temperature of the resist-coated substrate to an appropriate temperature for exposing processing; exposing the temperature-adjusted substrate; and developing the exposed substrate to form a resist pattern on the substrate surface.

Furthermore, the present invention provides a method of forming a pattern comprising the steps of: applying a resist on a surface of a substrate; exposing periphery of the resist-coated substrate outside a circuit-forming area thereon; adjusting a temperature of the peripheral-exposed substrate to an appropriate temperature for exposing processing; exposing the temperature-adjusted substrate; and developing the exposed substrate to form a resist pattern on the substrate surface.

Moreover, the present invention provides a method of forming a pattern comprising the steps of: applying a resist on a surface of a substrate; adjusting a temperature of the resist-coated substrate to an appropriate temperature for exposing processing; exposing the temperature-adjusted substrate; exposing periphery of the exposed substrate outside a circuit-forming area thereon; and developing the peripheral-exposed substrate to form a resist pattern on the substrate surface.

Furthermore, the present invention provides a method of forming a resist pattern on a surface of a substrate, for a coating and developing apparatus having a processor for applying a resist on a substrate and developing the substrate after being subjected to exposing processing and an interface section for transferring the substrate between the processor and an exposing apparatus for applying the exposing processing to the substrate, the method comprising the steps of: applying a resist on a surface of a substrate by the processor; transferring the resist-coated substrate from the processor to the interface section by a first transfer mechanism and adjusting a temperature of the resist-coated substrate to an appropriate temperature for the exposing processing in the interface section before the resist-coated substrate is transferred to the exposing apparatus; transferring the temperature-adjusted substrate from the interface section to the exposing apparatus by the first transfer mechanism and exposing the temperature-adjusted substrate by the exposing apparatus; and transferring the exposed substrate from the exposing apparatus to the processor via the interface section by the first transfer mechanism and developing the exposed substrate by the processor to form a resist pattern on the substrate surface.

BRIEF DESCRIPTION OF DRAWINGS

FIG. 4 is a perspective view showing an appearance of an embodiment of a coating and developing apparatus according to the present invention;

FIG. 10 is a sectional view showing a cooling unit provided in an interface section;

FIG. 11 is a plan view showing a main-transfer arm and a sub-transfer arm provided in an interface section;

DETAILED DESCRIPTION OF PREFERRED EMBODIMENTS

Preferred embodiments of a coating and developing apparatus according to the present invention will be disclosed with reference to the attached drawings.

Figure 3:
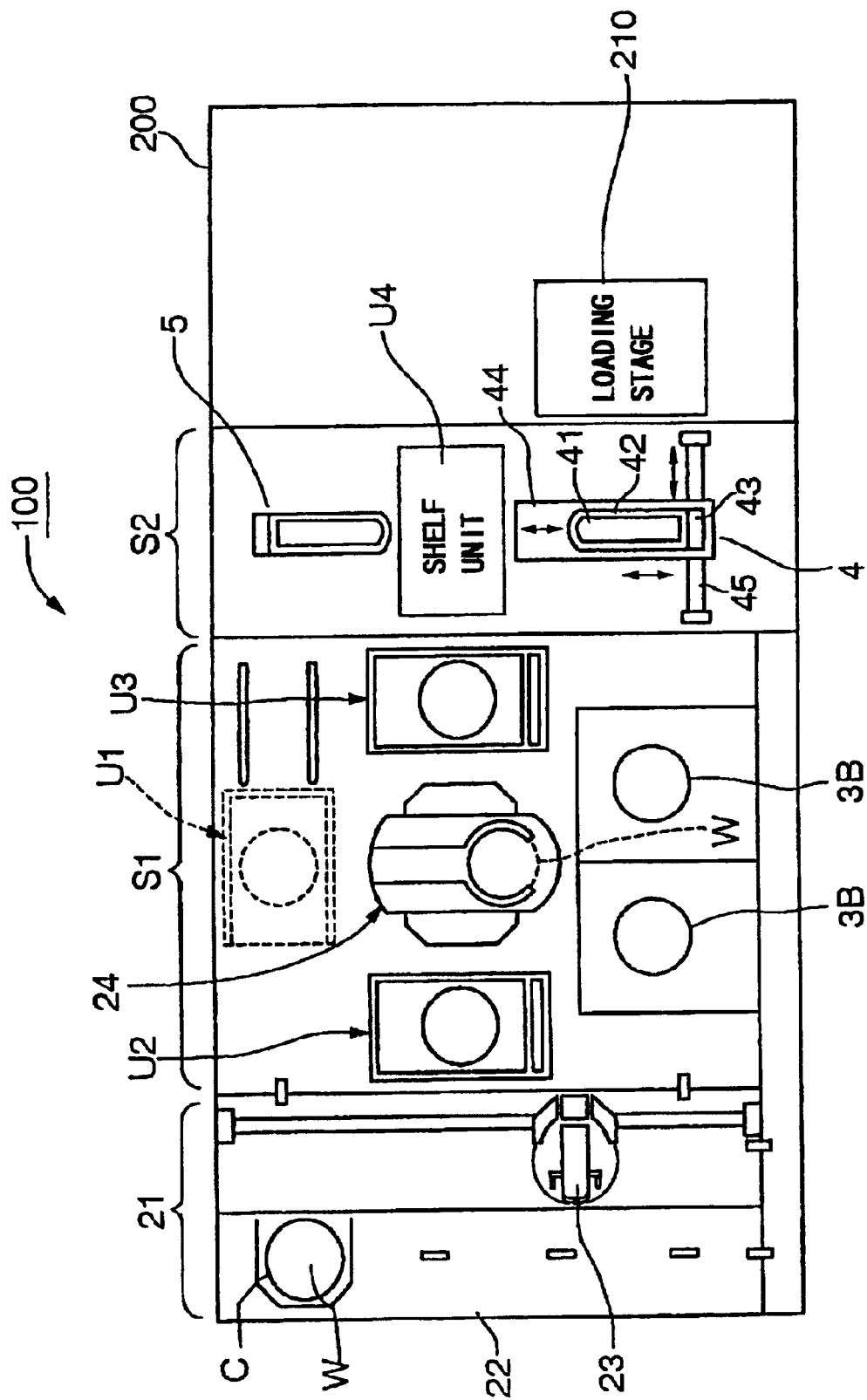
FIG. 3 is a plan view showing an entire structure of an embodiment of a coating and developing apparatus according to the present invention.

FIG. 3 is a plan view showing an entire structure of a resist-pattern forming system having a coating and developing apparatus 100 and an exposing apparatus 200 connected to each other. FIG. 4 illustrates an appearance of the resist-pattern forming system shown in FIG. 3.

In the drawings, a carrier station 21 is used for receiving and transferring a carrier C containing, for example, 25 semiconductor wafers (called wafers) W as substrates. The carrier station 21 is equipped with a carrier table 22 on which the carrier C will be set and a loading mechanism 23. The loading mechanism 23 takes out each wafer W (substrate) from the carrier C and transfers it to a processing section S1 provided behind the carrier station 21 viewed from the carrier table 22 side.

A main-transfer mechanism 24 is provided in the middle section of the processing section S1. When viewed from the carrier station 21 side, two coating units 3A and two developing units 3B are arranged on the right side, and shelf units U1, U2 and U3 are arranged on the left, the front and the right side, mechanism 24. Each of shelf units U1, U2 and U3 is provided with a stack of several heating and cooling units. The coating units 3A are set under the developing units 3B.

The coating unit 3A and the developing unit 3B are disclosed in detail.

Figure 5:
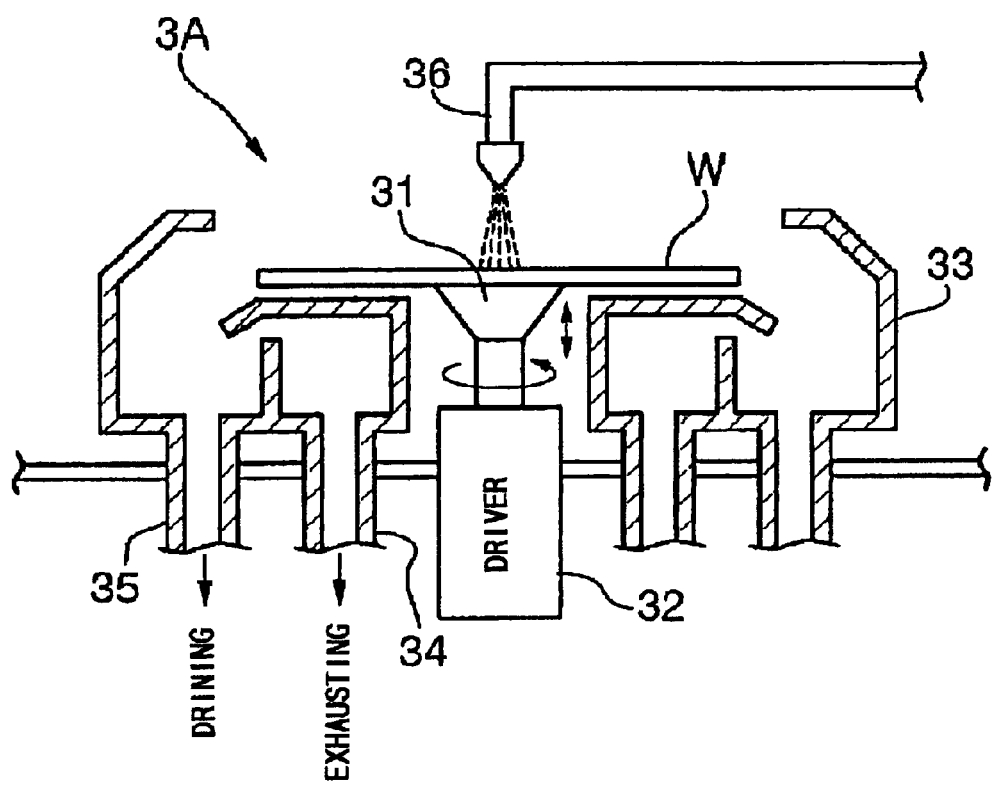
FIG. 5 is a vertical side view showing the main section of a coating unit.

An example of the coating unit 3A is disclosed with reference to FIG. 5. A spin chuck 31 is a substrate holder for holding a wafer W horizontally by vacuum suction. The spin chuck 31 is rotated about a vertical axis and elevated by a driver 32 having a motor and an elevating mechanism (both not shown).

Provided around the spin chuck 31 is a liquid cup 33 that covers the side section of both wafer W and spin chuck 31 and is formed with concavity on the entire lower periphery. Connected to the bottom of the cup 33 are an exhaust pipe 34 and a drain pipe 35. Provided over the cup 33 is a resist supply nozzle 36. The nozzle 36 is movable from the outside of the cup 33 to the center over a wafer W and vise versa.

In the coating unit 3A, a wafer W is transferred to the spin chuck 31 by the main-transfer mechanism 24. A resist solution is sprayed onto the center of the wafer W while the spin chuck 33 is rotating at a predetermined speed. The resist solution is spread over the wafer W in the radius direction due to the centrifugal force, thus a resist-coating film being formed on the wafer surface. The resist solution spit outside the wafer W is flown into the cup 33.

The developing unit 3B has almost the same structure as the coating unit 3A. The unit 3B is, however, equipped with a supply nozzle having many pores aligned for example in the diameter direction of a wafer W. A developing solution is supplied onto the center of the wafer W from the supply nozzle while the spin chuck 33 is rotating at a predetermined speed so that the wafer W is covered with the developing solution.

Figure 6:
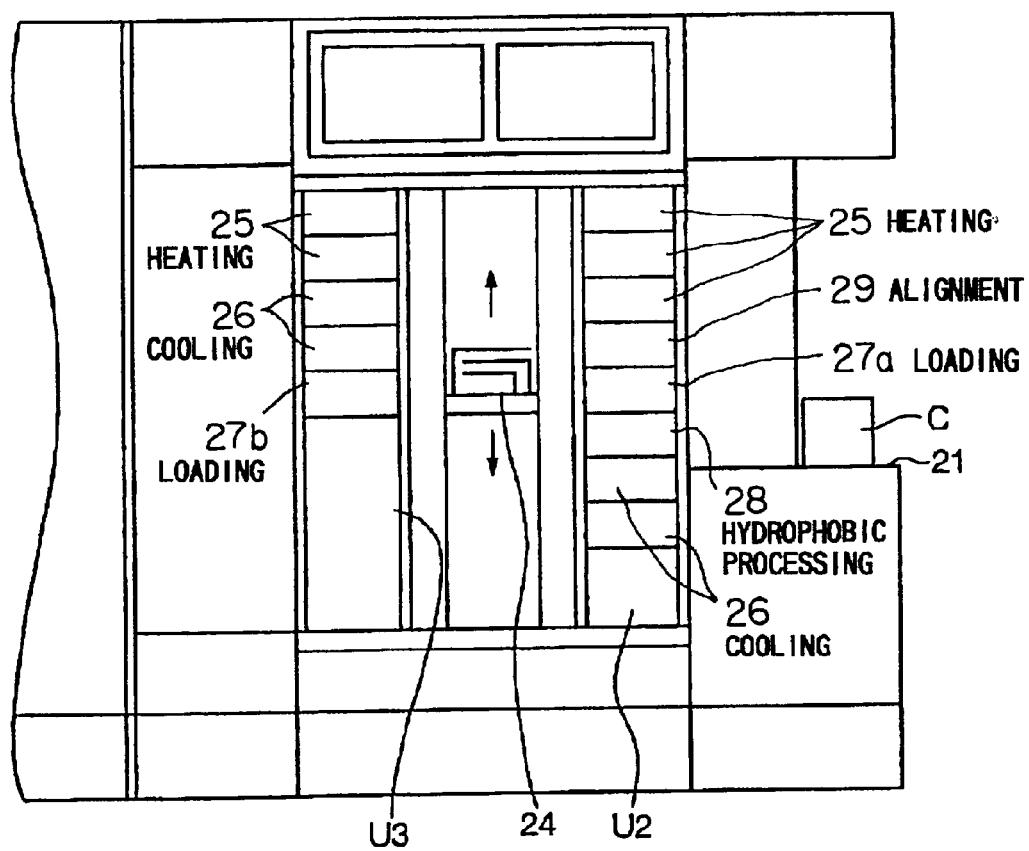
FIG. 6 is a vertical side view showing the main section of a shelf unit.

Although the shelf units U2 and U3 only are illustrated in FIG. 6, the shelf units U1, U2 and U3 are equipped with a stack of heating units 25, cooling units 26, wafer-loading units 27a and 27b, a hydrophobic processing unit 28 and an alignment unit 29, etc.

In the heating unit 25, a wafer W is set, for a predetermined period, on a plate heated to a predetermined temperature so that it is heated to the predetermined temperature. In the cooling unit 26, a wafer W is set, for a predetermined period, on a plate cooled to a predetermined temperature so that it is cooled to the predetermined temperature.

The loading units 27a and 27b are equipped with a loading table having for example elevatable pins. The unit 27a receives and transfers a wafer W between the loading mechanism 23 of the carrier station 21 and the main-transfer mechanism 24 of the processing section S1. The unit 27b receives and transfers a wafer W between the main-transfer mechanism 24 of the processing section S1 and a main-transfer arm 4 of an interface section S2 which will be described later.

The main-transfer mechanism 24 can move upward/downward and forward/backward, and rotate about a vertical axis, for transferring wafers W among the shelf units U1 U2 and U3, the coating units 3A and developing units 3B. The loading mechanism 23 and the main-transfer mechanism 24 are not shown in FIG. 4 for simplicity.

Figure 7:
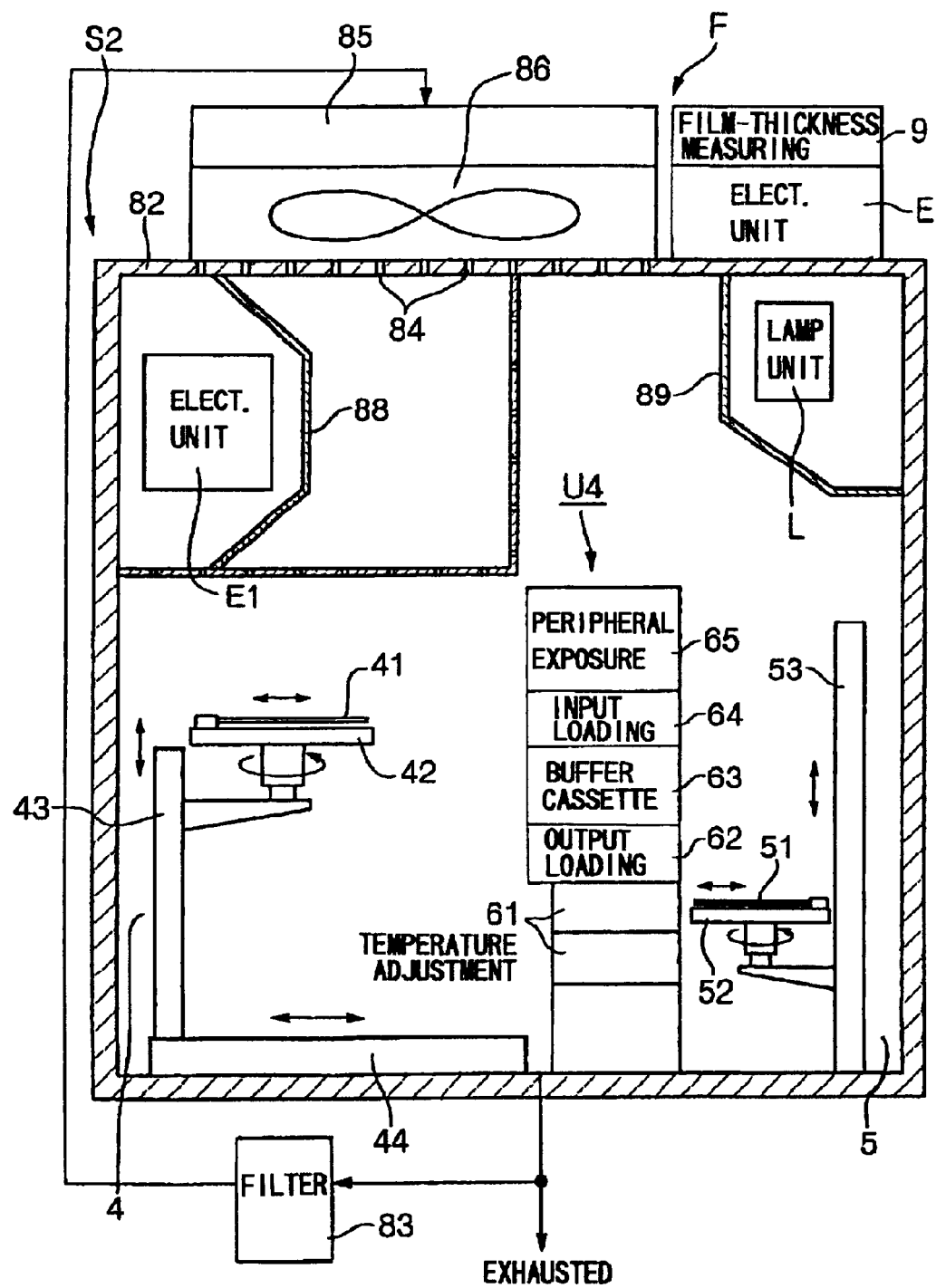
FIG. 7 is a sectional view showing an interface section viewed from the carrier station side.

The processing section S1 is connected to an exposing apparatus 200 via the interface section S2. As shown in FIGS. 3 and 7, the sectional views from the exposing apparatus 200 side, the interface section S2 is equipped with a shelf unit U4 almost at the center, which has the stack of a peripheral exposing unit and a buffer cassette unit, etc. Also provided in the interface section S2, behind the carrier station 21 viewed from the station 21, are the main-transfer arm 4 (a first transfer mechanism) at the right side and a sub-transfer arm 5 (a second transfer mechanism) at the left side, both aligned almost on a straight line.

Figure 8:
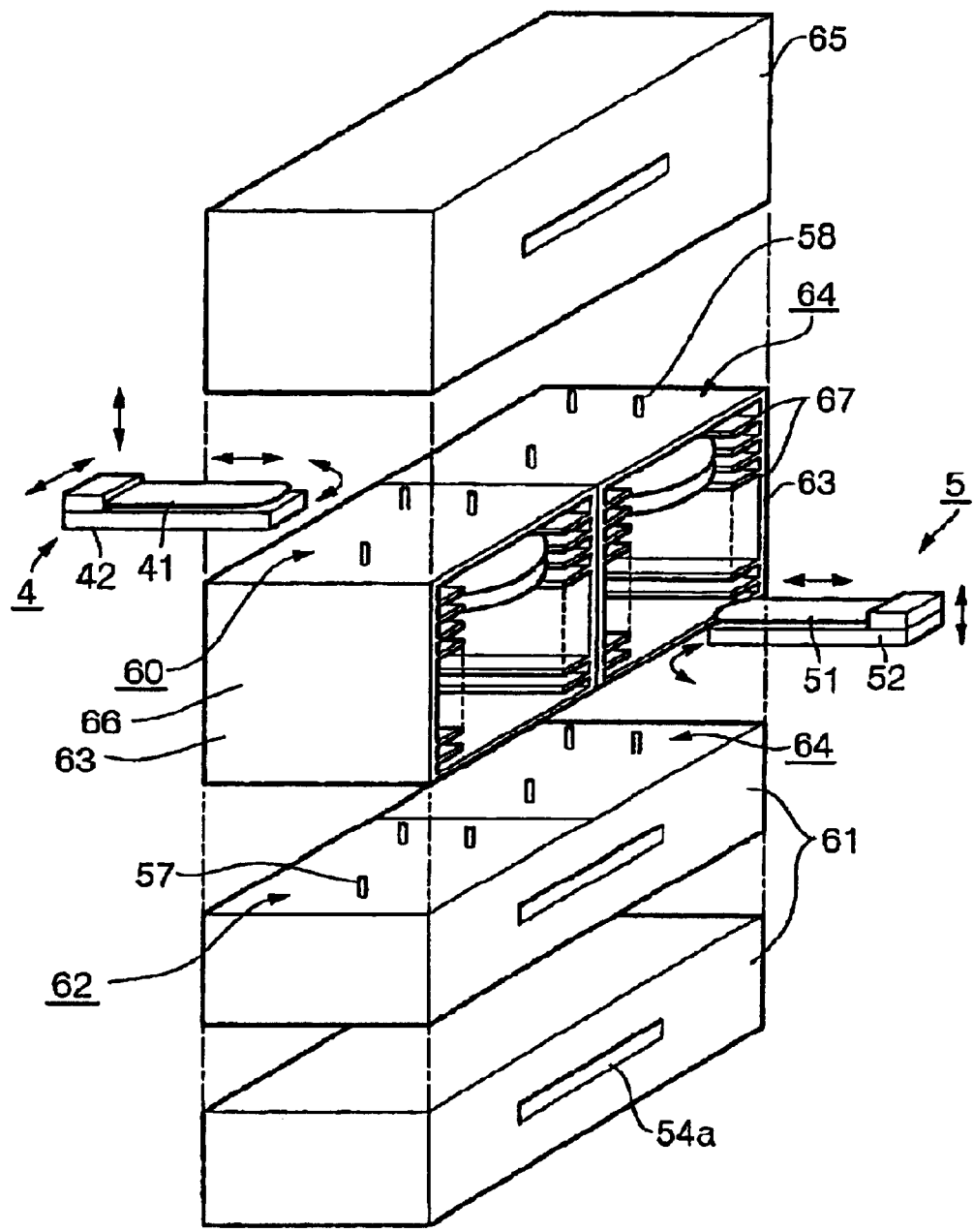
FIG. 8 is a perspective view showing an example of a shelf unit provided in an interface section.
Figure 9:
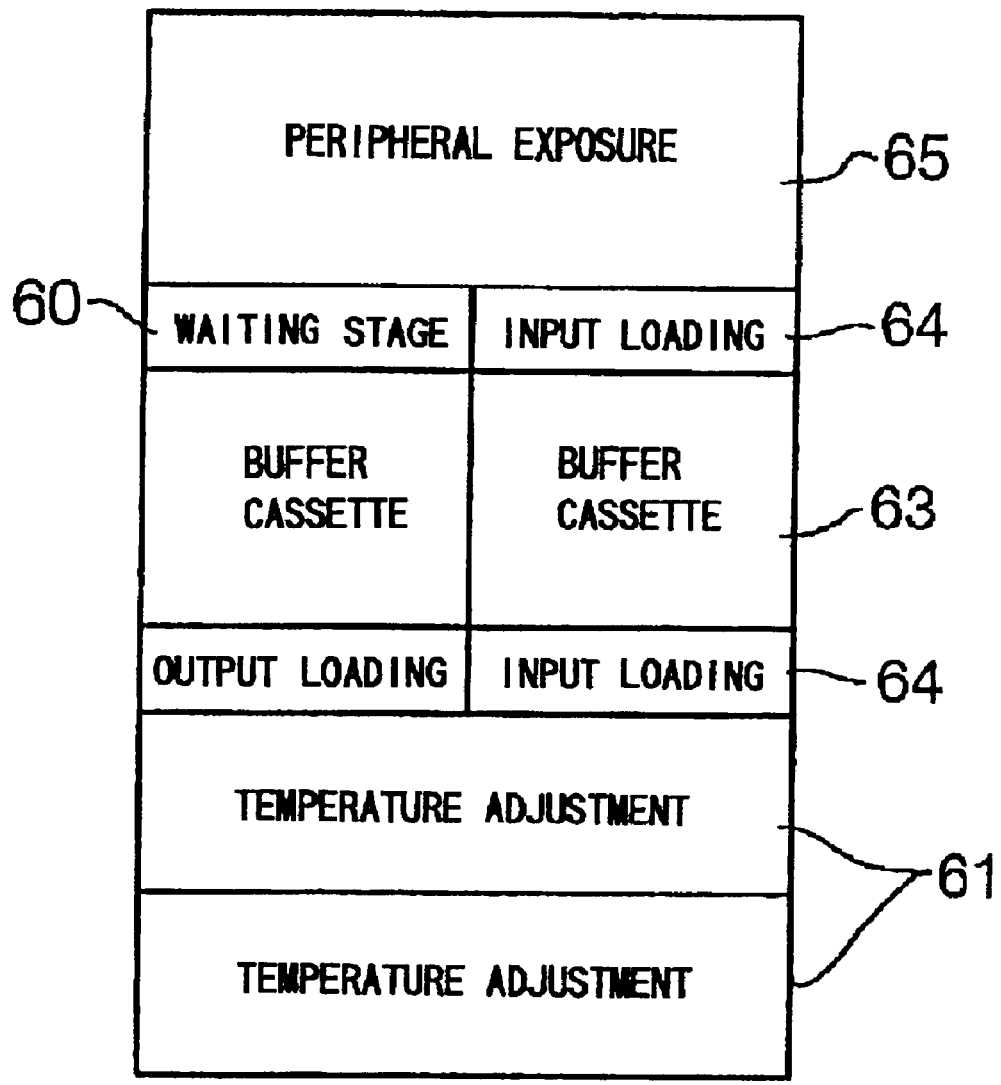
FIG. 9 is a side view showing the self unit viewed from the sub-transfer arm side.

In the shelf unit U4, as shown in FIG. 8 (the perspective view) and FIG. 9 (the side view looked at from the sub-transfer arm 5 side), two temperature-adjusting units 61, an output loading unit 62, an input loading unit 64, two buffer cassettes 63, a waiting stage 60, another input loading unit 64 and a peripheral exposing apparatus 65 are stacked in this order from the bottom. The output loading unit 62 and the input loading unit 64 over the temperature-adjusting units 61 are aligned when viewed from the sub-transfer arm 5 side. The buffer cassettes 63, the waiting stage 60 and the other input loading unit 64 are also aligned when viewed from the sub-transfer arm 5 side.

The main-transfer arm 4 transfers a wafer W between the cooling units 26 and the loading unit 27b, etc., in the shelf unit U3 of the processing section S1. The main-transfer arm 4 further transfers a wafer W among the output loading unit 62, the input loading unit 64 and the temperature-adjusting units 61 in the shelf unit U4 of the interface section S2 and also the loading stage 210 of the exposing apparatus 200. For such transfer, an arm 41 is provided as movable forward and backward along a base 42. The base 42 itself is rotatable about a vertical axis and movable upward/downward along a vertical guide rail 43, forward/backward along a first horizontal guide rail 44 in a first horizontal-axis direction towards the shelf unit U4 (or movable in a lateral direction behind the carrier station 21 viewed from the station 21), and also slidable along a second horizontal guide rail 45 in a second horizontal-axis direction orthogonal to the first horizontal-axis direction (or movable in a longitudinal direction behind the carrier station 21 viewed from the station 21).

The sub-transfer arm 5 transfers a wafer W among the units in the interface section S2. For such transfer, an arm 51 is provided as movable forward and backward along a base 52. The base 52 itself is rotatable about a vertical axis and movable upward/downward along a vertical guide rail 53.

The temperature-adjusting unit 61 has a plate made of aluminum or ceramics, etc., for adjusting the temperature of a wafer W set thereon to a set temperature, provided in a housing 54 having an inlet 54a and an outlet 54b. More precisely, the temperature-adjusting unit 61 is equipped with a temperature-adjusting plate 55 and an elevating-pin mechanism 56 for setting a wafer W on the plate 55. Provided in the temperature-adjusting plate 55 are, for example, a thermo-module, a cooling mechanism with cooling pipes and a heating mechanism with a heating resistor.

Both output and input loading units 62 and 64 receive and transfer a wafer W between the main-transfer arm 4 and the sub-transfer arm 5, both arms being provided at reachable locations. As shown in FIG. 8, the lower output and input loading units 62 and 64 are aligned on the second temperature-adjusting unit 61 from the bottom. Moreover, as shown in FIG. 11, the sub-transfer arm 5 is situated at a position facing almost the center of the output and input loading units 62 and 64. The upper input loading unit 64 and the waiting stage 60 are aligned on the two buffer cassettes 63. The sub-transfer arm 5 is also situated at a position facing almost the center of the waiting stage 60 and the upper input loading unit 64.

Each temperature-adjusting unit 61 has a plurality of, for example, three protrusions formed thereon. Each buffer cassette 63 also has a plurality of, for example, three protrusions formed thereon. These protrusions are formed at positions where they are not interfere with the arms 41 and 51 of the main- and sub-transfer arms 4 and 5, respectively, when the arms 4 and 5 move forward to the respective positions for receiving and transferring a wafer W.

A wafer W is temporarily loaded onto the waiting stage 60 from the sub-transfer arm 5 at a sudden power-off like a power outage while the wafer W is set on the arm 5, for a wafer-recovery operation by the arm 5. For, example, the sub-transfer arm 5 temporarily loads the wafer W onto the waiting stage 60 and reaches other units to recover wafers W. The waiting stage 60 thus has the same structure as the loading units 62 and 64.

Each buffer cassette 63 has a container 66 for containing the stack of a predetermined number of wafers W. The buffer cassettes 63 receive and transfer a wafer W from and to the sub-transfer arm 5. Each buffer cassette 63 thus has an opening for the container 66 towards the sub-transfer arm 5 so that the arm 5 can reach the wafers W contained in the container 66. Racks are formed in the container 66 vertically with a predetermined gap therebetween for holding edges of the wafers W so that they are arranged vertically.

It is the requirements for the three loading units that two are used as input loading units to the interface section S2, and the remaining one is used as an output loading unit. For example, the two units provided on the temperature-adjusting units may be used as the input loading units and the unit provided on the buffer cassettes 63 may be used as the output loading unit. Different from this arrangement, two input loading units may be provided on the buffer cassettes 63 and one output loading unit and the waiting stage 60 may be provided on the temperature-adjusting units 61. The waiting stage 60 may not always necessary.

Figure 12:
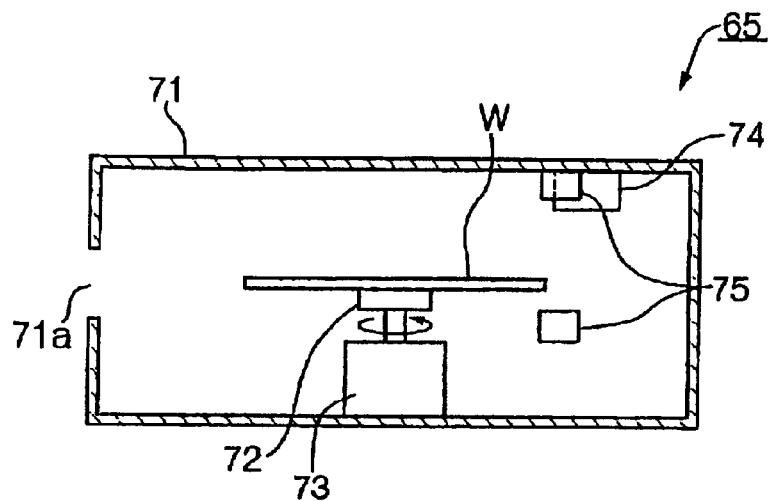
FIG. 12 is a sectional view showing a peripheral exposing apparatus provided in an interface section.

The peripheral exposing apparatus 65 performs exposure on the periphery of each wafer W to remove the resist applied on the periphery outside a circuit-forming area. As illustrated in FIG. 12, the peripheral exposing apparatus 65 is equipped, in a housing 71 having an inlet/outlet 71a, with a table 72 on which a wafer W is set, a driving mechanism 73 for rotating and moving the table 72 in X- and Y-directions, an exposing unit 74 set so as to face the periphery of the wafer W, and line sensors 75 for detecting the periphery of the wafer W, provided over and under the wafer W so that an area of the wafer W to be detected passes through between the sensors.

In this embodiment, the main-transfer arm 4 can reach the input loading unit 64, the output loading unit 62 and the temperature-adjusting unit 61. The sub-transfer arm 5 can reach the input loading units 64, the output loading unit 62, the temperature-adjusting units 61, the buffer cassettes 63, the peripheral exposing apparatus 65 and the waiting stage 60. Not only this embodiment, it is preferable that the main-transfer arm 4 also can reach the waiting stage 60 and/or the sub-transfer arm 5 only can reach the temperature-adjusting units 61.

Figure 13:
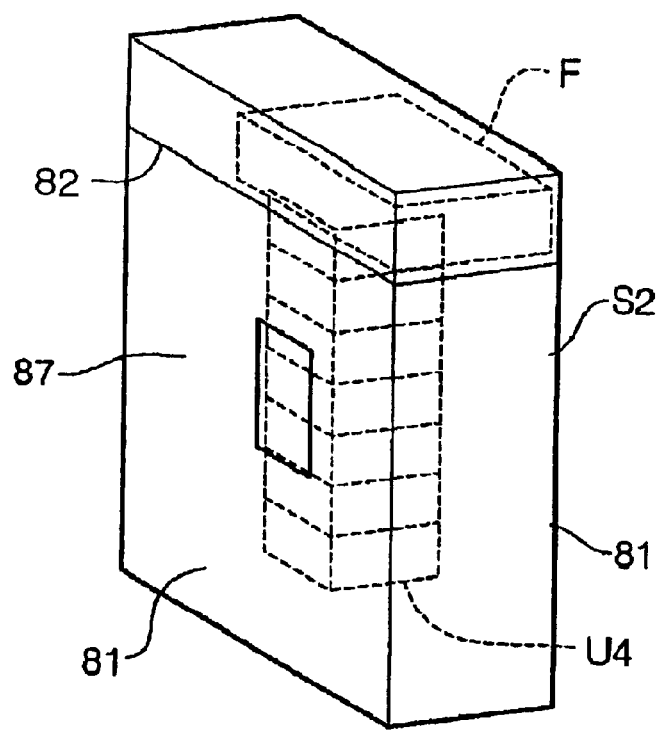
FIG. 13 is a perspective view showing an appearance of an interface section.

The interface section S2 is an airtight frame, as shown in FIG. 13, with exterior frame walls on the right and left and partitions 81 against the processing section S1 and the exposing apparatus 200. Provided on a ceiling 82 is a clean-air filter unit F. As shown in FIG. 7, air inside the interface section S2 is exhausted to a factory exhausting system (not shown) while a portion of the air is sent to a filtering apparatus 83 for removing impurities. Air purified by the filtering unit 83 is then sent to the filter unit F and flown down into the interface section S2 through air vents 84 formed on the ceiling 82. This down-flow air prevents temperature increase inside the interface section S2.

The filter unit F is equipped with a filtering section having a filter for air purification and a chemical filter 85 containing acid for removing alkalis such as ammonia and amine and an intake fan 86, etc.

The filtering apparatus 83 is equipped with an impurity remover for removing impurities from air and an adjuster for adjusting air at specific temperature and humidity and emitting the adjusted air.

A temperature- and humidity-adjusted air is flown into the interface section S2 in this embodiment. Not only that, the outside air may be taken into the filter unit F and then flown down into the interface section S2.

The interface section S2 is further provided with an inlet/outlet 87 as shown in FIG. 13 for receiving and transferring a wafer W from and to the shelf unit U3 of the processing section S2 and the loading stage 210 of the exposing apparatus 200. The inlet/outlet 87 at the exposing apparatus 200 side is not shown for simplicity.

Provided over the main-transfer arm 4 in the interface section S2 is an electrical unit E1 covered by a partition wall 88 as shown in FIG. 7. Air from the filter unit F is also passed through the partition wall 88 and flown into the interface section S2. Provided over the sub-transfer arm 5 is a lamp unit L covered by a partition wall 89.

A film-thickness measuring instrument 9 is set on another electrical unit E2 on the ceiling 82 and in the vicinity of the filter unit F.

The electrical units E1 and E2 include electrical facility such as a power supply for the driving mechanisms of the main-transfer arm 4, the sub-transfer arm 5, the temperature-adjusting unit 61 and peripheral exposing apparatus 65, etc, a controller for power control and a power board for power supply.

The lamp unit L includes a lamp, a condensing mirror and a controller for controlling these lamp and mirror. The film-thickness measuring instrument 9 is a light-interference film-thickness measuring instrument including, for example, a microscope, a spectrogragh and a data processor. A light beam emit from a light source is radiated onto a wafer W through an objective lens. The light beam reflected from the wafer W is incident to the spectrogragh. The incident refection spectrum is analyzed by a computer for film-thickness measurement.

In this embodiment of a coating and developing apparatus according to the present invention, a carrier C is always transferred onto the carrier table 22 from the outside of the apparatus, and the wafers W are taken out from the carrier C by the loading mechanism 23 one by one.

Each wafer W is transferred from the loading mechanism 23 to the main-transfer mechanism 24 via the loading unit 27a of the shelf unit U2, and further to the shelf unit U2 (U1 or U3) for hydrophobic and cooling processing, etc.

The wafer W is then sprayed with a resist solution and heated for evaporating the resist solution. The solution-evaporated wafer is cooled by the cooling unit 26 of the shelf unit U3. The cooled wafer W is transferred by the main-transfer arm 4 of the interface section S2 to the loading unit 64 in the interface section S2.

The wafer W in the loading unit 64 is transferred by the sub-transfer arm 5 to the peripheral exposing apparatus 65. After peripheral exposure, the wafer W is transferred by the sub-transfer arm 5 to the buffer cassette 63. The wafer W is then transferred by the sub-transfer arm 5 to the temperature-adjusting unit 61 and subjected to temperature adjustments, for example, cooled to a set temperature suitable for exposing processing at the exposing apparatus 200.

The wafer W in the temperature-adjusting unit 61 is taken out by the main-transfer arm 4 and transferred to the loading stage 210 of the exposing apparatus 200.

The wafer W for which exposing processing has been completed in the exposing apparatus 200 is returned to the processing section S1 along the route of the loading stage 210 of the exposing apparatus 200→the main-transfer arm 4 of the interface section S2→the loading unit 27b of the shelf unit U3.

The wafer W is further transferred by the main-transfer mechanism 24 to the developing unit 3B for developing processing. In detail, the wafer W is heated and cooled before developing processing.

The wafer W for which developing processing has been completed is transferred to the loading mechanism 23 along the reverse route to the route described above and returned to the carrier C that has been set on the carrier table 22.

This embodiment of a coating and developing apparatus is provided with the temperature-adjusting units 61 in the interface section S2, for adjusting the temperature of each wafer W to a temperature suitable for exposing processing before transfer to the exposing apparatus 200 even when the wafer temperature is increased due to peripheral exposure.

This temperature adjustment provides almost constant temperature to the wafers W for stable exposing processing with less effects of heat, thus achieving high yields for exposing processing and high productivity.

Moreover, in this embodiment, the main-transfer arm 4 performs wafer transfer between the processing section S1 and the interface section S2, and between the interface section S2 and the exposing apparatus S4 whereas the sub-transfer arm 5 performs wafer transfer among the units in the shelf unit U4 in the interface section S2.

In other words, the two transfer arms perform wafer transfer separately in the interface section S2. This two-arm wafer-transferring processing decreases the number of processing for each arm for enhanced transfer-arm performance and also high throughput even when the peripheral exposing apparatus 65 and the temperature-adjusting unit 61 are provided in the interface section S2.

Figure 1:
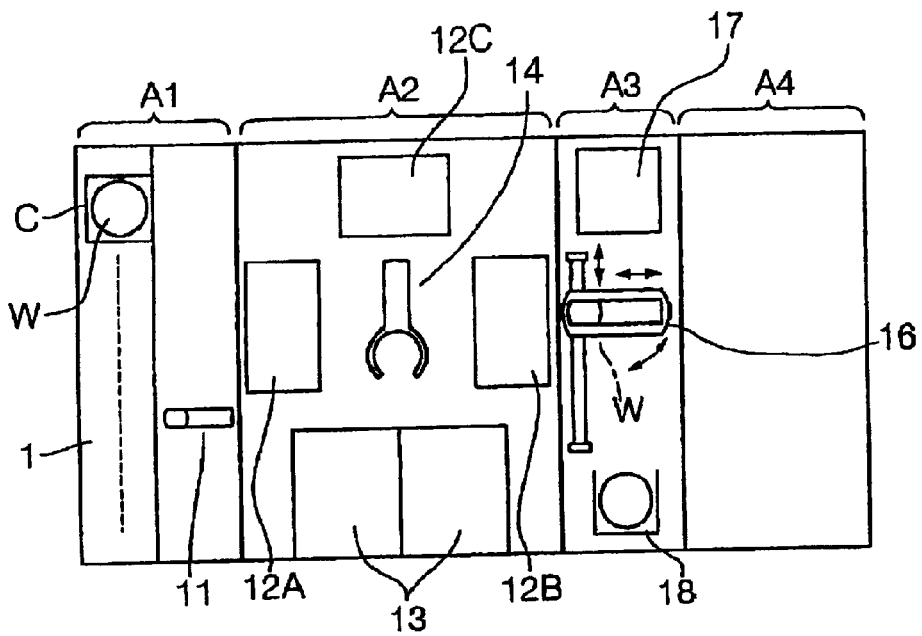
FIG. 1 is a plan view showing a known coating and developing apparatus.
Figure 2:
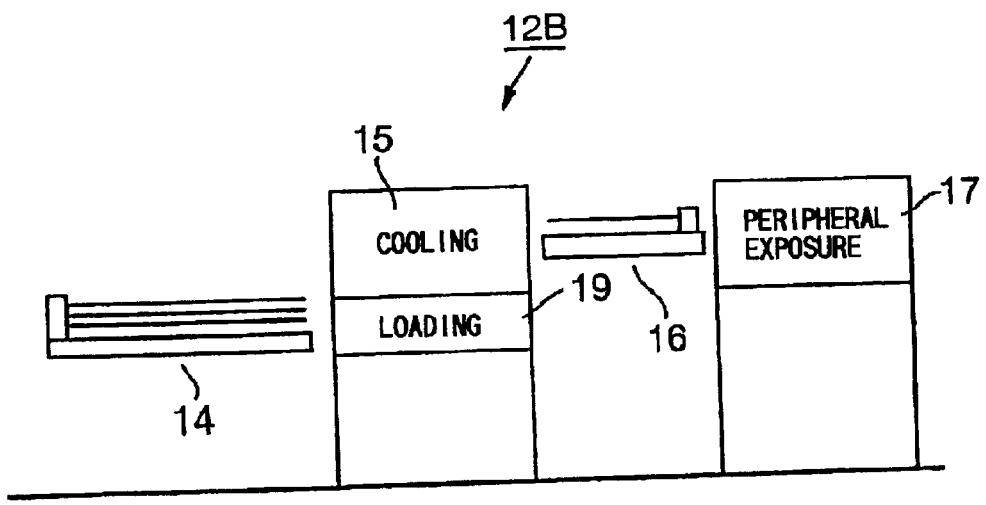
FIG. 2 is a sectional view showing an interface section of the known coating and developing apparatus.

In detail, as shown in FIGS. 1 and 2, in the known apparatus, one transfer arm 16 performs wafer transfer along the route of the cooling unit in the processing section→the peripheral exposing apparatus of the interface section→the buffer cassette→the loading stage of the exposing apparatus in the processing block A2 that corresponds to the interface section S2 in the present invention.

Contrary to this, in the present invention, the main-transfer arm 4 performs wafer transfer from the cooling unit 26 of the processing section S1 to the loading unit 64 of the interface section S2. After this main-arm transfer, the sub-transfer arm 5 performs wafer transfer from the peripheral exposing apparatus 65 of the interface section S2 to the buffer cassette 63 and further to the temperature-adjusting unit 61. And then, the main-transfer arm 4 transfers each wafer W to the loading stage 210 of the exposing apparatus 200.

In other words, the main-transfer arm 4 serves to transfer wafers W in sections or units that could suffer a big temperature change whereas the sub-transfer arm 5 serves to transfer them W in sections or units that will have almost constant temperature.

The wafer-transfer processing in this invention, requires more number of transferring steps than the known system. The operating speed for the sub-transfer arm 5 is, however, higher than the main-transfer arm 4 and those of the known system because the number of driving shafts for the sub-transfer arm 5 is smaller, by one, than the main-transfer arm 4 and those of the known system. This high operating speed and division of wafer transfer for the main- and sub-transfer arms in which the number of transferring steps is different between the two arms offer enhanced transfer-arm performance and high throughput.

Moreover, in the foregoing embodiment, a temperature- and humidity-adjusted air is flown down into the interface section S2 for less thermal effects to the peripheral exposing apparatus 65 and the temperature-adjusting units 61 situated inside the interface section S2, thus a constant temperature is given inside the section S2. This air down-flow mechanism prevents temperature change from occurring on a wafer W before being transferred to the exposing apparatus 200 and also a wafer W after exposed but before being transferred to the processing section S1, which may otherwise occur if the temperature inside the interface section S2 fluctuates, thus thermal effects to the later processing being reduced.

Air from the filter unit F is also flown down into the partition wall 88 that covers the electrical unit E1 in this embodiment, for protecting partition wall 88 and also the other spaces inside the interface section S2 from temperature increase, thus achieving temperature stability inside the section S2.

Not only providing a temperature- and humidity-adjusted air, the outside air may be flown down into the interface section S2 via the filter unit F for temperature stability inside the section S2 because of air circulation.

Furthermore, the main-transfer arm 4 and the sub-transfer arm 5 are aligned almost on a straight line so that they face each other with the shelf unit U4 interposed therebetween for the peripheral exposing apparatus 65 and the temperature-adjusting unit 61 etc situated in the interface section S2. This arrangement ensures the spaces for the several apparatus and units in the lengthwise direction of the coating and developing apparatus 100 (X-direction almost orthogonal to the direction in which several carriers C are aligned on the carrier station 21 in FIG. 3), for less increase in footprints.

Disclosed next are modifications to wafer transfer for the interface section S2 in the coating and developing apparatus disclosed above.

In detail, a wafer W received by the main-transfer arm 4 from the cooling unit 26 in the shelf unit U3 of the processing section S1 may be transferred along the route of the input loading unit 64→the sub-transfer arm 5→the peripheral exposing apparatus 65→the sub-transfer arm 5→the buffer cassette 63→the sub-transfer arm 5→the temperature-adjusting unit 61→the main-transfer arm 443 the exposing apparatus 200→the main-transfer arm 4→the input loading unit 64→the sub-transfer arm 5→the buffer cassette 63→the sub-transfer arm 5→the output loading unit 62.

A wafer W received by the main-transfer arm 4 from the cooling unit 26 in the shelf unit U3 of the processing section S1 may also be transferred along the route of the input loading unit 64→the sub-transfer arm 5→the buffer cassette 63→the sub-transfer arm 5→the temperature-adjusting unit 61→the main-transfer arm 4→the exposing apparatus 200→the main-transfer arm 4→the input loading unit 64→the sub-transfer arm 5→the peripheral exposing apparatus 65→the sub-transfer arm 5→the output loading unit 62.

Moreover, a wafer W received by the main-transfer arm 4 from the cooling unit 26 in the shelf unit U3 of the processing section S1 may also be transferred along the route of the input loading unit 64→the sub-transfer arm 5→the buffer cassette 63→the sub-transfer arm 5→the temperature-adjusting unit 61→the main-transfer arm 4→the exposing apparatus 200→the main-transfer arm 4→the input loading unit 64→the sub-transfer arm 5→the buffer cassette 63→the sub-transfer arm 5→the peripheral exposing apparatus 65→the sub-transfer arm 5→the output loading unit 62.

The main-transfer arm 4 and the sub-transfer arm 5 are preferably controlled as disclosed below in the interface section S2 for higher throughput.

This transfer control solves a problem occurring in wafer transfer from the main-transfer arm 4 to the sub-transfer arm 5 via the input loading unit 64 in that the main-transfer arm 4 cannot start wafer transfer to the loading unit 64 before the sub-transfer arm 5 takes out a wafer W that has already been transferred to the loading unit 64.

In order to avoid such a problem, in wafer transfer from the main-transfer arm 4 to the input loading unit 64, when the sub-transfer arm 5 starts to take out a wafer W that has already been transferred to the loading unit 64, the main-transfer arm 4 simultaneously starts to transfer a next wafer W to the loading unit 64.

This main- and sub-transfer control shortens a waiting time for the main-transfer arm 4 to start wafer transfer, thus achieving higher throughput.

Wafer transfer from the sub-transfer arm 5 to the main-transfer arm 4 can also be performed in a similar way, in wafer transfer from the sub-transfer arm 5 to the output loading unit 62, when the main-transfer arm 4 starts to take out a wafer W that has already been transferred to the loading unit 62, the sub-transfer arm 5 simultaneously starts to transfer a next wafer W to the loading unit 62.

The present invention, not only limited to the foregoing embodiment, includes any arrangements in which at least the temperature-adjusting unit 61 in the interface section S2 adjusts a temperature of a wafer W transferred from the processing section S1 to the exposing apparatus 200 to a most appropriate temperature for exposing processing. In such an arrangement, peripheral exposure may not always necessary or may be performed after the exposing processing.

A heater may be provided as the temperature-adjusting unit for heating a wafer W to an appropriate temperature when the temperature of the wafer W transferred from the processing section 1 to the exposing apparatus 200 is lower than the most appropriate temperature for the exposing processing. The peripheral exposing apparatus 65 may not be provided in the interface section S2.

The temperature-adjusting unit 61 may be provided in the interface section S2 so that the main-transfer arm 4 can reach the unit 61.

The structure of the shelf unit U4 in the interface section S2 is not limited to the foregoing arrangement, for example, a heating unit or a CHP (Chilling Hot Plate) unit may be included. The peripheral exposing apparatus 65 may be provided in the processing section S1.

The arrangement of the main-transfer arm 4, the shelf unit U4 and the sub-transfer arm 5 is flexible with the least requirement that the main-transfer arm 4 performs wafer transfer among the processing section S1, the shelf unit U4, the exposing apparatus 200 and the loading units 62 and 64, and the sub-transfer arm 5 performs wafer transfer to and from the shelf unit U4. The best arrangement for the main- and sub-transfer arms 4 and 5 is that the two arms are aligned on a almost straight line with the shelf unit U4 interposed therebetween, for less footprints, as described above. The buffer cassette 63 may have two openings facing the main- and sub-transfer arms 4 and 5, respectively.

Substrates processed by the present invention may be LCD substrates.

As disclosed above, a resist-coated substrate is transferred to the exposing apparatus after a temperature of the substrate is adjusted to a most appropriate temperature for exposing processing by the temperature-adjusting unit provided in the interface section in the present invention. The temperature adjustments before exposure provide almost the same temperature over many substrates for a stable exposing processing, thus achieving high yields.

Moreover, the present invention is provided with the first and the second transfer mechanisms in the interface section, the first serving to transfer substrates between the processing section and the exposing apparatus and the second serving to transfer substrates to each unit of the shelf section, thus achieving high throughput even though temperatures of substrates are adjusted before transferring to the exposing apparatus.

What is claimed is:

1. A coating and developing apparatus comprising:
   a carrier table on which at least one carrier containing a plurality of substrates is set;
   a processor for applying a resist on each substrate taken out from the carrier set on the carrier table and developing the substrate after being subjected to exposing processing;
   an interface section for transferring the resist-coated substrate between the processor and an exposing apparatus for applying the exposing processing to the resist-coated substrate, the interface section having an airtight structure and located between the processor and the exposing apparatus;
   at least one temperature adjuster for adjusting a temperature of the substrate to an appropriate temperature for the exposing processing before the substrate is transferred to the exposing apparatus; and
   a transfer mechanism for transferring the substrate among the processor, the temperature adjuster and the exposing apparatus, the temperature adjustor and the transfer mechanism being housed in the airtight structure.

2. The coating and developing apparatus according to claim 1, further comprising:
   a peripheral exposing apparatus for exposing a periphery of the substrate outside a circuit-forming area thereon to ultraviolet radiation, the peripheral exposing apparatus being housed in the airtight structure, wherein the transfer mechanism transfers the substrate among the processor, the temperature adjuster and the peripheral exposing apparatus.

3. The coating and developing apparatus according to claim 2, wherein the interface section includes a plurality of temperature adjusters stacked under the peripheral exposing apparatus.

4. The coating and developing apparatus according to claim 1, wherein the temperature adjuster adjusts a temperature of the substrate, of which the periphery outside a circuit-forming area thereon has been exposed, to the appropriate temperature for the exposing processing.

5. The coating and developing apparatus according to claim 1, wherein the interface section further includes a clean-air filter unit, air passed through the clean-air filter unit being flown down into the interface section.

6. The coating and developing apparatus according to claim 5, wherein the interface section further includes an electrical unit housing electrical facility, the air passed through the clean-air filter unit being also flown down into a space for the electrical unit in the interface section.

7. A coating and developing apparatus comprising:
   a carrier table on which at least one carrier containing a plurality of substrates is set;
   a processor for applying a resist on each substrate taken out from the carrier set on the carrier table and developing the substrate after being subjected to exposing processing;
   an interface Section for transferring the resist-coated substrate between the processor and an exposing apparatus for applying the exposing processing to the resist-coated substrate, the interface section having an airtight structure and located between the processor and the exposing apparatus;
   a shelf section having a plurality of processing units for containing or processing the substrate;
   a first transfer mechanism for transferring the substrate between the processor and the exposing apparatus; and
   a second transfer mechanism for receiving the substrate transferred from the processor by the first transfer mechanism and transferring the received substrate to any of the units of the shelf section, the shelf section and the first and second transfer mechanisms being housed in the airtight structure.

8. The coating and developing apparatus according to claim 7, wherein the shelf section of the interface section includes at least one temperature adjuster for adjusting a temperature of the substrate to an appropriate temperature for the exposing processing before the substrate is transferred to the exposing apparatus, the substrate being transferred to the temperature adjuster by the first and/or the second transfer mechanisms.

9. The coating and developing apparatus according to claim 8, wherein the temperature adjuster adjusts the temperature of the substrate, of which the periphery outside the circuit-forming area thereon has been exposed, to the appropriate temperature for the exposing processing.

10. The coating and developing apparatus according to claim 7, further comprising:

a peripheral exposing apparatus, as one of the units, for exposing periphery of the substrate outside a circuit-forming area thereon to ultraviolet radiation, the peripheral exposing apparatus being housed in the airtight structure, the substrate that has been transferred from the processor by the first transfer mechanism being transferred to the peripheral exposing apparatus by the second transfer mechanism.

11. The coating and developing apparatus according to claim 7, wherein the interface section further includes a loading unit, as one of the units, for loading the substrate between the first and the second transfer mechanisms, the substrate being transferred among the processor, the exposing apparatus and the loading unit by the first transfer mechanism and being transferred between the loading unit and any of the units of the shelf section by the second transfer mechanism.

12. The coating and developing apparatus according to claim 7, wherein the processing units are stacked in the shelf section.

13. The coating and developing apparatus according to claim 7, wherein the first and the second transfer mechanisms are aligned on an almost straight line, as the first and the second transfer mechanisms face each other with the shelf section interposed therebetween, in a direction almost parallel to another direction in which the carrier is set on the carrier table.

14. The coating and developing apparatus according to claim 7, wherein the first transfer mechanism has an arm for transferring the substrate, that is movable upward, downward, forward and backward and rotatable about a vertical axis, and movable in a direction of a horizontal axis.

15. The coating and developing apparatus according to claim 7, wherein the second transfer mechanism has an arm for transferring the substrate, that is movable upward, downward, forward and backward and rotatable about a vertical axis.

16. The coating and developing apparatus according to claim 7, wherein the interface section further includes a clean-air filter unit, air passed through the clean-air filter unit being flown down into the interface section.

17. The coating and developing apparatus according to claim 16, wherein the interface section further includes an electrical unit housing electrical facility, the air passed through the clean-air filter unit being also flown down into a space for the electrical unit in the interface section.

18. A coating and developing apparatus comprising:

a carrier table on which at least one carrier containing a plurality of substrates is set;

a processor for applying a resist on each substrate taken out from the carrier set on the carrier table and developing the substrate after being subjected to exposing processing;

an interface section for transferring the resist-coated substrate between the processor and an exposing apparatus for applying the exposing processing to the resist-coated substrate, the interface section having an airtight structure and located between the processor and the exposing apparatus;

at least one temperature adjuster for adjusting a temperature of the substrate to an appropriate temperature for the exposing processing before the substrate is transferred to the exposing apparatus;

a transfer mechanism for transferring the substrate among the processor, the temperature adjuster and the exposing apparatus; and a peripheral exposing apparatus for exposing periphery of the substrate outside a circuit-forming area thereon to ultraviolet radiation, the transfer mechanism transferring the substrate among the processor, the temperature adjuster, and the peripheral exposing apparatus, and wherein the transfer mechanism is housed in the airtight structure.

* * * * *